(12) United States Patent
Basu et al.

(10) Patent No.: US 7,539,966 B2
(45) Date of Patent: May 26, 2009

(54) ENHANCED OP3 ALGORITHMS FOR NET CUTS, NET JOINS, AND PROBE POINTS FOR A DIGITAL DESIGN

(75) Inventors: Tamal Basu, New Delhi (IN); Saurabh Gupta, Pin (IN); Tahir Malik, Fremont, CA (US); Hitesh Suri, San Jose, CA (US)

(73) Assignee: DCG Systems, Inc., Fremont, CA (US)

( * ) Notice: Subject to any disclaimer, the term of this patent is extended or adjusted under 35 U.S.C. 154(b) by 420 days.

(21) Appl. No.: 11/502,951

(22) Filed: Aug. 11, 2006

(65) Prior Publication Data

US 2007/0283308 A1 Dec. 6, 2007

Related U.S. Application Data

(60) Provisional application No. 60/811,000, filed on Jun. 5, 2006.

(51) Int. Cl.
*G06F 17/50* (2006.01)

(52) U.S. Cl. .................... 716/11; 716/9; 716/10
(58) Field of Classification Search ............... 716/1, 716/9–11, 18
See application file for complete search history.

(56) References Cited

U.S. PATENT DOCUMENTS

| 5,675,499 A | 10/1997 | Lee et al. ............... 716/19 |
| 6,292,929 B2 * | 9/2001 | Scepanovic et al. ......... 716/14 |

* cited by examiner

*Primary Examiner*—Sun J Lin
(74) *Attorney, Agent, or Firm*—Deborah Wenocur

(57) ABSTRACT

Enhanced algorithms are provided for finding circuit edit locations which utilize automated conversions from circuit schematic to physical layout design. The enhanced algorithms further include a user interface enabling the user to provide preferences, limitations, and constraints in order to bias the search to be conducted, as well as using the provided design data in order to locate the best positions for particular edit schemes, including net cuts and net joins.

28 Claims, 8 Drawing Sheets

US 7,539,966 B2

ENHANCED OP3 ALGORITHMS FOR NET CUTS, NET JOINS, AND PROBE POINTS FOR A DIGITAL DESIGN

CROSS-REFERENCE TO RELATED APPLICATIONS

This application is related to commonly owned U.S. Pat. No. 5,675,499 issued Oct. 7, 1997. It is also related to U.S. Provisional Patent Application No. 60/811,000, filed Jun. 5, 2006, from which it claims priority.

FIELD OF THE INVENTION

This invention relates to the optimization and automation of FIB edits, and in particular to accurately predicting the optimal placements of Probe Points, Net Cuts, and Net Joins on silicon devices in order to achieve specific purposes of layout structural change while maintaining logic design integrity.

BACKGROUND OF THE INVENTION

As integrated circuits get smaller and faster, and as chip designs become increasingly complex, effective probing and debugging of circuits increases in importance. Probes are used for analysis, by way of example, to observe the effects of applying a signal to the external pins of a device, on the device nodes. Probing systems include mechanical probe, electron beam probe, focused ion beam (FIB), and laser beam probes. Additionally, charged particle beam systems such as FIB systems can perform circuit edits including cuts and joins of the power lines (referred to as nets), which are essential to effective characterization, design debug, and modification. These are illustrated in FIG. 1.

Finding the optimal location on a circuit for any of the above-mentioned acts, i.e., probing the device, performing a net cut or a net join, is a critical step in performing the circuit analysis or debug. Much effort has gone into establishing rules and techniques for determining the suitability of locations therefore on the chip. In particular, U.S. Pat. No. 5,675,499 issued Oct. 7, 1997, describes probe-point placement methods and rules for ranking the suitability of net locations for probing and for cutting a probe-point hole. U.S. Pat. No. 5,675,499 is incorporated herein in its entirety.

Prior methods have required that the operator specify an approximate location on the circuit layout, within which the net is broken into polygons which are evaluated and ranked for suitability for probing, e.g. Providing the location on the circuit layout requires that there be an interface between the circuit schematic and the physical layout. This interface is generally manual, i.e., involving communication between circuit designers and layout engineers, which is often a difficult and time-consuming task, since the circuit design and circuit layout are generally performed by completely different personnel in different, possibly remote, groups.

A method for providing an automated interface between circuit schematic and physical layout, which would enable circuit designers, even those unaware of FIB processes and their limitations, to easily and quickly identify locations on a chip corresponding to desired probing or modification, would greatly streamline and simplify probing, analysis, and modification of circuits, e.g. for debug purposes, as well as providing faster turnaround time.

Additionally, there is a need for increased user input in terms of establishing guidelines, preferences, and weighting of rules for evaluating optimal placement of probes, cuts, and joins.

SUMMARY OF THE INVENTION

It is therefore an object of this invention to provide enhanced algorithms for finding circuit edit locations which utilize automated conversions from circuit schematic to physical layout design.

It is a further object of this invention to provide enhanced algorithms for finding circuit edit locations which include a user interface enabling the user to provide preferences, limitations, and constraints in order to bias the search to be conducted.

It is a further object of this invention to provide enhanced algorithms for finding circuit edit locations which use the provided design data in order to locate the best positions for particular edit schemes, including net cuts and net joins.

DETAILED DESCRIPTION OF THE INVENTION

The present invention provides a suite of algorithms known as the OP3 suite, which is a set of procedures providing suggestions regarding the best location on a chip for a particular edit to be carried out.

Figure 2:
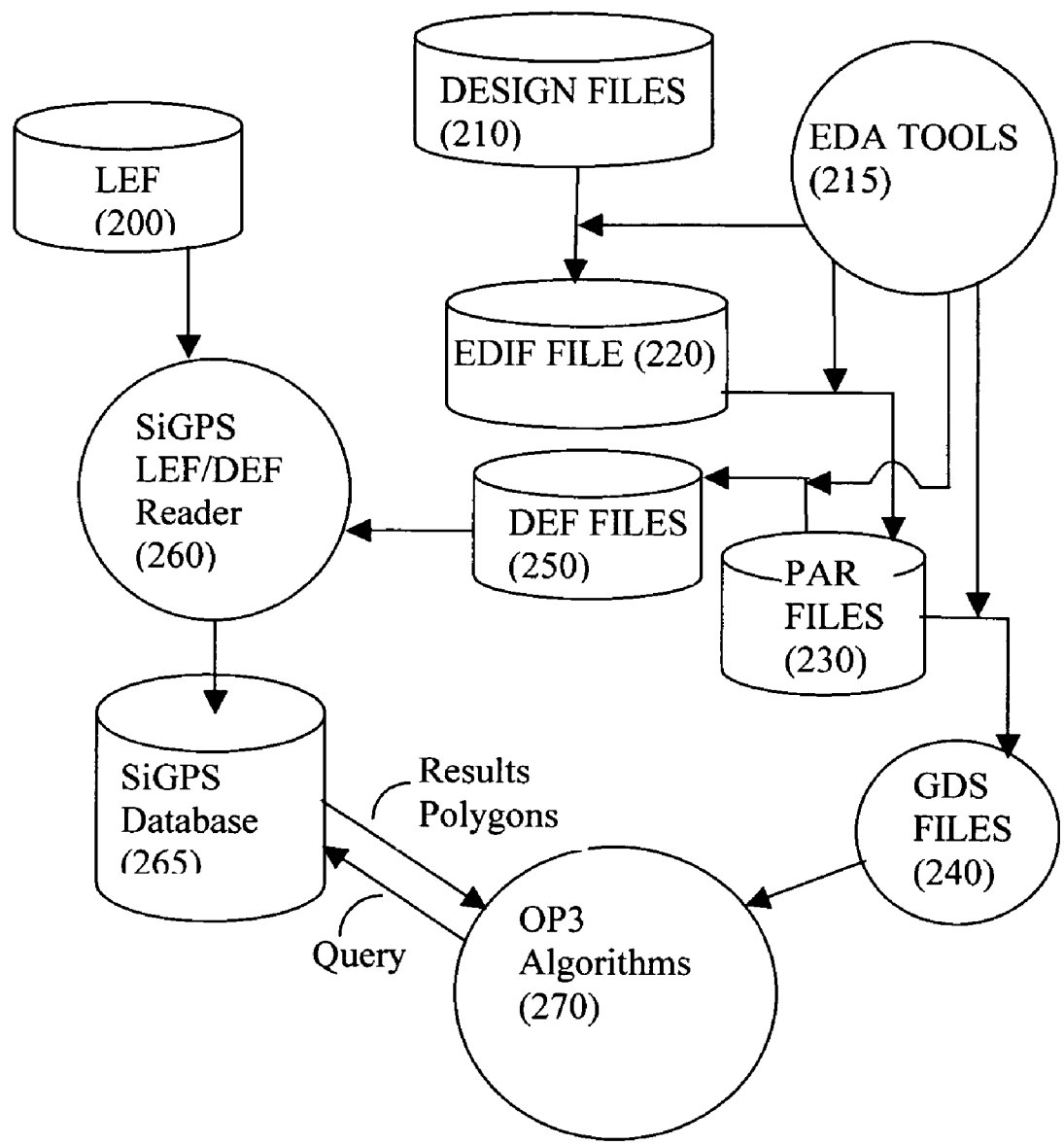
FIG. 2 is a flow chart showing an example of how the OP3 algorithm interacts with design files, layout files, and database files.

The interaction of the OP3 algorithm suite with design files, layout files, and database files is illustrated in FIG. 2. Note that this description is exemplary, and that other formats or types of files may be used. The critical aspect is that an easily accessible database file including design, layout, and connectivity data, is provided to be accessed by the optimization algorithms described hereinafter. Library Exchange Format (LEF) files 200 contain building blocks of different Functional Units, e.g. NAND gates, in layout form, and depend on the design rules and the particular fab and technology. LEF files are normally provided by the fab for each chip. Design files 210 (created by the circuit designers) are generally created in VHDL or Verilog formats—both ASCII files in high level logic-based languages. Electronic Design Automation (EDA) tools 215 then synthesize, i.e., convert the design files to gate level Net lists in an Electronic Design Interchange Format (EDIF) file 220. From the EDIF file the EDA tools form Placement And Route (PAR) files 230 which include the actual placement and routing of the Functional Units. From the PAR files, the EDA tools create the fabrication level GDS files 240, which show the actual layer-by-layer layout. The GDS files yield a local description of the layers, but do not include the descriptions of net names, cell names, or higher level connectivity. However, the EDA tools can optionally create Design Exhange Format (DEF) files 250 from the PAR files. The DEF files describe how the Functional Unit building blocks are placed and connected by nets, according to the circuit design and design rules. The DEF file is therefore a circuit design in layout format, and includes net connectivity and cell placement. Both LEF file 200 and DEF file 250 are in high level ASCII format.

The LEF and DEF files are read by SiGPS LEF/DEF Reader 260, then converted into an efficient, easily accessible binary format in SiGPS database file 265. The SiGPS database file and LEF/DEF reader are Credence products. Aspects of these products are described in U.S. patent application Ser. No. 11/363,787 filed on Feb. 27, 2006 entitled APPARATUS AND METHOD FOR CIRCUIT OPERATION DEFINITION, which is hereby incorporated by reference in its entirety. When queried, the database file can provide locations of polygons which satisfy specified conditions as to net, functional unit, and region. OP3 algorithms 270 utilize GDS files 240 and database file 265 to determine optimal placements of probe points, net cuts, and net joins as described hereinafter.

The OP3 algorithm suite includes the following features:

| | |
|---|---|
| a. Establishing an interface with a feeder system to acquire all feature polygons on a given design | a. This includes<br>  I. Getting all the polygons which relate to a particular net within the design, from SiGPS.<br>  II. Getting all polygons which relate to a particular field of view<br>  III. Getting all polygons which relate to a particular wild card search based on a hierarchical naming convention |
| b. Applying user defined constraints and limitations to optimal edit location searches | b. The user is provided with an interface to provide preferences, limitations and constraints in order to bias the search to be conducted. This is done by<br>  I. Providing the user with the ability to determine the order in which rules are applied. This is significant since it allows for pruning away results initially which are deemed to by unsuitable.<br>  II. Providing the user with the ability to determine the weights of rules which are being applied simultaneously, such that the results returned from that cycle of evaluation are biased one way or another.<br>  III. Providing the user with rule bypass options in order to prevent evaluation of results from a search based on an inappropriate or unsuitable rule.<br>  IV. Providing the user with threshold values to ensure that only those results meeting a predetermined quality level are returned. |
| c. Use enhanced algorithms to find the exact optimal edit location under the constraints. | c. The enhanced algorithms are capable of using the provided design data in order to locate the best positions for particular edit schemes. In particular,<br>  I. Given a net and a particular set of evaluation rules, the algorithm is capable of evaluating all locations of the net in order to establish which are the best locations on the net to place a probe point.<br>  II. Given two nets or a net and a functional unit, the algorithm is capable of finding the best schemes which can be used to logically link the two.<br>  III. Given a net, or a net and a functional unit, the algorithm is capable of deciding which are the best schemes of isolating the net from the functional unit, or isolating any given two points on the net.<br>  IV. The isolation of the two points on the net can be iteratively extended to the isolation of two sets of points on the same net and can thereby return a set of edits, subject to a maximum number if required, which would achieve the same. |
| d. Report the edit location | d. The backend system housing the enhanced algorithms will be connected to a layout display system, and subject to the number of results requested by the user, will be able to display all edit suggestions back to the user who initiated the request. The user can then view each suggestion, view its characteristics and scores and select the one which suits the attempted operation the most. |

Figure 1:
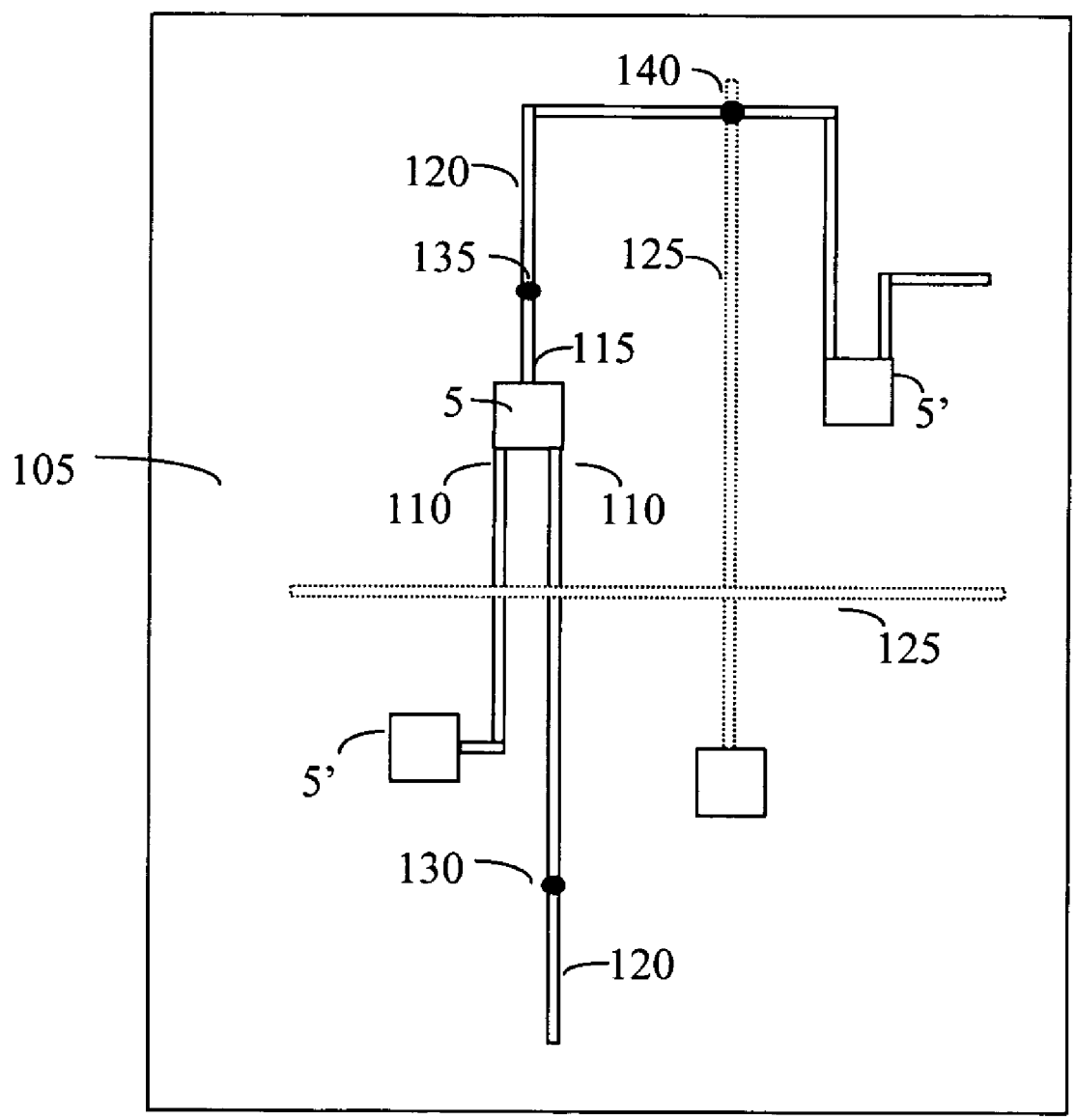
FIG. 1 illustrates probe point edits, net cut edits, and net join edits.

Although the description will use a FIB edit as an exemplary application of the algorithms, it is to be understood that the inventive algorithms are not constrained to being used for a FIB edit. For example, other types of circuit editing systems such as electron beam or laser editing may be utilized. The algorithms are directed to three types of edits: probe point edits, net cut edits, and net join edits. These three types of edits are illustrated in FIG. 1. Circuit 105 includes Functional Unit 5, which may be a NAND gate, by way of example, with inputs 110 and output 115, and interconnected by metal interconnections 120, which are on a first net, (i.e., carrying a first signal through the layout) to other Functional Units 5'. Metal interconnections 125 are on a second net, i.e., carrying a second signal through the layout. The metal interconnections 120 and 125 may be at differing metal layers and depths below the surface. Probe point location 130 represents an optimal location to place a probe in contact with a net, in this case the first net. Net cut 135 is at a location so as to isolate a signal, in this case the signal from the output 115 from the NAND gate. Net join 140 serves to connect the first and second nets, and requires the addition of conducting material as a connection.

1. Probe Point Edits

The algorithms for probe point selection are set forth in previously incorporated U.S. Pat. No. 5,675,499. The features of these algorithms will be described herein as clarification, since they are applied in the following net cutting and net joining algorithms.

A probe point edit is an edit wherein the user wishes to place a probe in contact with a net which is carrying a particular signal through a layout. In many cases it is necessary to accurately determine the value of the signal which is being carried over the net, and whether it matches the expected value of the signal for a particular set of input signals to the circuit. In order to make this determination it is necessary to first expose the net in question either from the backside or the frontside, using a process such as a FIB process, and to then deposit a conducting material to bring the net up to the surface where it can then be probed. There are several issues and restrictions to this kind of process, and these issues cause one point on a net to be more suited to probing than another point on the same net. The probe point algorithm described hereinafter simplifies determination of the optimal probing locations.

Requirements for the Algorithm

The required inputs for this algorithm are given as follows.

| Requirements | Explanation |
|---|---|
| Net Name | This represents the Net which needs to be probed. |
| A Locality | A locality may be provided in order to restrict the search to within that region only. In case the locality is not provided the algorithm conducts a |

| Requirements | Explanation |
|---|---|
| | search for the best locations for probing, over all polygons of the given feature to be probed, in this case a net. It is necessary however that the locality, if specified, should contain at least one sub part of the feature which is to be probed. |
| Rules & Rule Weights | There are several rules, which are specified, in order to determine whether a particular point is better suited for probing as compared to other points. This comparison between the different points is done based on a particular set of rules. In some cases, some rules may be more important than others, and so weights are provided by the user for each of the rules in order to emphasize or de-emphasize the application of that particular rule. Some examples of rules are: 1) the proximity rules according to which the closer an adjoining polygon is to the current area being evaluated as a candidate probe point, the less desirable that candidate point becomes for probing; 2) the centrality rule which states that the closer to the center of the design a candidate probe point is, the more desirable it becomes as a probe point. |
| Process Type | The type of process could either be a Front Side process or a Backside process and selecting one or the other would cause an inversion of at least some of the rules being applied, e.g., in the case of the depth rule. |
| Non Flexible Parameters of the edit | It may be the intention of the operator to deal with algorithm suggestions which necessarily conform to one or more particular characteristic. E.g. the user may decide that if the total probing score for a particular candidate point is less than a certain threshold value then it should be immediately discarded. Similarly, the operator may decide that he wishes to consider probe points only on the upper two layers of the design and so all points below those two layers should be discarded. These non-flexible parameters of the algorithm allow the operator to do so. |
| Number of Results | Using this input the user can control the number of suggestions to be returned by the algorithm |

Note that a description of the individual rules for probe-point optimization is given in previously incorporated U.S. Pat. No. 5,675,499.

Functioning of the Probe Point Algorithm

Figure 3A:
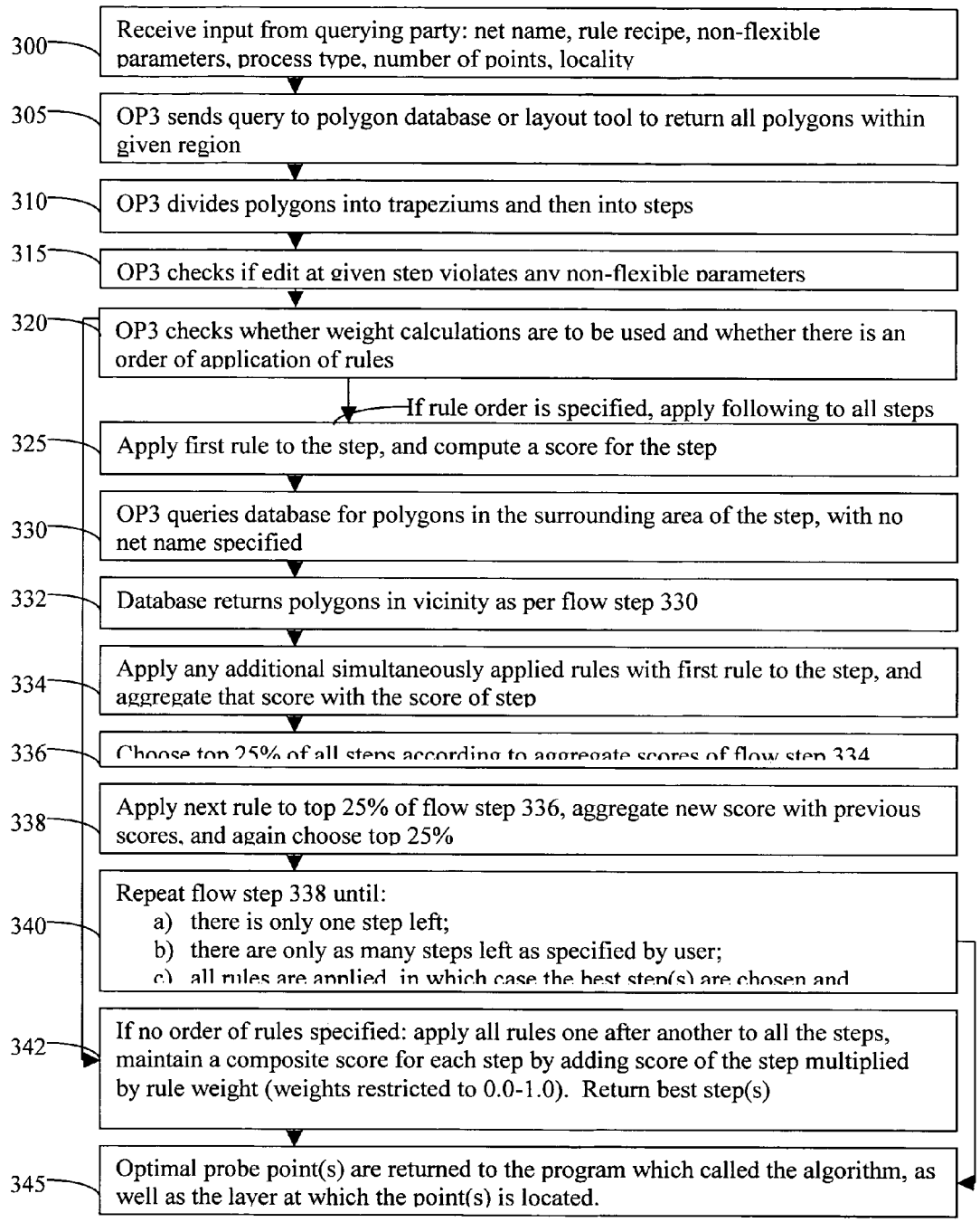
FIG. 3a is a flow chart of the OP3 probe point algorithm.

The functioning of the probe point algorithm is illustrated in FIG. 3a and described below:

In flow step 300, the input is received from the querying party containing the name of the net, the rule recipe to be used, non-flexible parameters, process type and number of points to be returned and the locality for the search to be carried out.

In flow step 305, OP3 then sends a query to the polygon database or layout tool, which contains the name of the net and if required, the locality of the region, to return all polygons. The database will reply back with all the polygons for that net within the given region.

In flow step 310, once OP3 has received all the polygons, it divides each polygon into trapeziums, to account for non-rectangular polygons and then subdivides each trapezium into equal sized steps. The steps are created along whichever axis of the trapezium is longer. The steps are generally square in shape, although under certain cases, such as at the extremities of polygons, they may be rectangular in shape. Their typical size depends on the technology, but are generally between 45×45 nm to 90×90 nm for a 65 nanometer technology.

Once all the steps are created the OP3 algorithm carries out the following calculations, flow steps 315-340, on each step, assuming that there is an order specified for all the rules to be applied in the recipe.

In flow step 315, OP3 checks whether an edit if placed at a given step would violate any of the non-flexible parameters, which have been specified for the query.

In flow step 320, OP3 checks whether weighted calculations are to be used or whether there is an order of application of rules.

In flow step 325, assume that the recipe calls for certain rules to be applied in a particular order. In this case the first rule is applied to the step. Using the system defined in U.S. Pat. No. 5,675,499, including applying relative weighting to each rule, a score is computed for the step.

In flow step 330 (which is optional according to the rule recipe), in order to determine the number of polygons in the surrounding area of the step, OP3 sends a query to the database with no net name but in the locality surrounding the step. This query is performed to return all surrounding polygons within a specified radius of the step in question, irrespective of which net or hierarchy they belong to, so as to evaluate rules such as milling, flatness, proximity, and safety rules, whose scores are dependent on surrounding features of different nets as well. In flow step 332, the database returns all the polygons which are located in the specified locality as requested in flow step 330. In flow step 334, if there is any other rule which is applied simultaneously with the previous rule, then that other rule is applied for each step, and the score for that rule is aggregated with the score for the step using the previous rule.

In flow step 336, once the aggregate rule of step 334 has been applied to all the steps, the top 25% of all the steps are chosen to streamline the search.

In flow step 338, the next rule is then applied to this top 25% and once again the best 25% are chosen. In this case the score aggregates with the scores from the previous round.

In flow step 340, the sequence of flow step 338 is repeated until either
 a) There is only one step left
 b) There are only as many steps left as what the user specifies
 c) All the rules are applied, in which case the best step/steps are chosen and returned.

In flow step 342, (which is an alternate flow which replaces flow steps 315-340), in the case that there is no order specified, all the rules are applied one after the other to all the steps, and the score for each step is maintained by adding the score of the step for each rule multiplied by the weight given for that rule with the aggregate score for that step. In order to maintain a top-heavy score for one particular rule, the weights are restricted to lie between 0.0 and 1.0. Note that in this case and for flow steps 315-340, the rules are adjusted for the type of process. The top number of steps as chosen by the user are then selected.

In flow step 345, once OP3 has completed its calculations, the optimal probe point(s), i.e., the steps with the top scores as calculated in flow step 342, which have been computed, are returned to the program which called the algorithm, along with the layer at which the point is located.

2. Net Cutting OP3 Algorithm

A Net Cut operation is an edit, generally performed with FIB, where parts of or entire polygons are removed from a net in order to isolate a signal being carried by the net. Usually a net is used to drive the input to a functional unit on a chip (defined as any logical unit on a chip which has one or more inputs and one or more outputs, and is capable of modifying either the logical or timing characteristics of the input signal), and/or to carry the output from a functional unit. When a Net Cut is carried out, it usually results in isolating either an input or an output of a functional unit. Therefore, one of the requirements of a query to the OP3 net cutting algorithm is that both the functional unit and the net which needs to be cut must be specified among the input parameters.

Requirements for the Algorithm

| Requirements | Explanation |
| --- | --- |
| Net Name A | This represents the first Net, which needs to be isolated from the Functional Unit. |
| Functional Unit | The Functional Unit from which we want to isolate the net mentioned above. The Net in question may either be driving an input or an output of the Functional Unit |
| Locality | A locality may be provided in order to restrict the search of the algorithm to that particular region only. In case the locality is not provided the algorithm searches the whole net in order to find out the best location/set of locations, to carry out the isolation. It is necessary however that the locality area include the functional unit to be isolated and at least one polygon of the net from which it must be isolated." |
| Rules & Rule Weights | There are several rules, which are specified, in order to determine whether a particular point is better suited for cutting as compared to other points. This comparison between the different points is done based on a particular set of rules. In some cases, some rules may be more important than others, and so weights are provided for each of the rules in order to emphasize or de-emphasize the application of that particular rule. |
| Process Type | The type of process could either be a Front Side process or a Backside process and selecting one or the other would cause an inversion of the rules being applied |
| Non Flexible Parameters of the edit | It may be the intention of the operator to deal with algorithm suggestions, which conform to one or more particular characteristic. Possible non flexible parameters of the net cut may be locations/areas which cannot be affected by the net isolation, i.e. must have uninterrupted logic driving through them. Another possibility is that all cuts should be limited to particular layers such as topmost layers or bottom most layers. |
| Maximum Cut Number | This number is important because it gives the algorithm greater flexibility in choosing how to make a cut such that the Functional Unit is completely isolated from the Net. This is so, because as the net extends away from the point the operator may wish to isolate, it branches out and so in order to completely isolate the input all the branches have to be isolated, which may require using cuts on all of them |
| Number of Results | Using this input the user can control the number of suggestions to be returned by the algorithm |

Figure 3B:
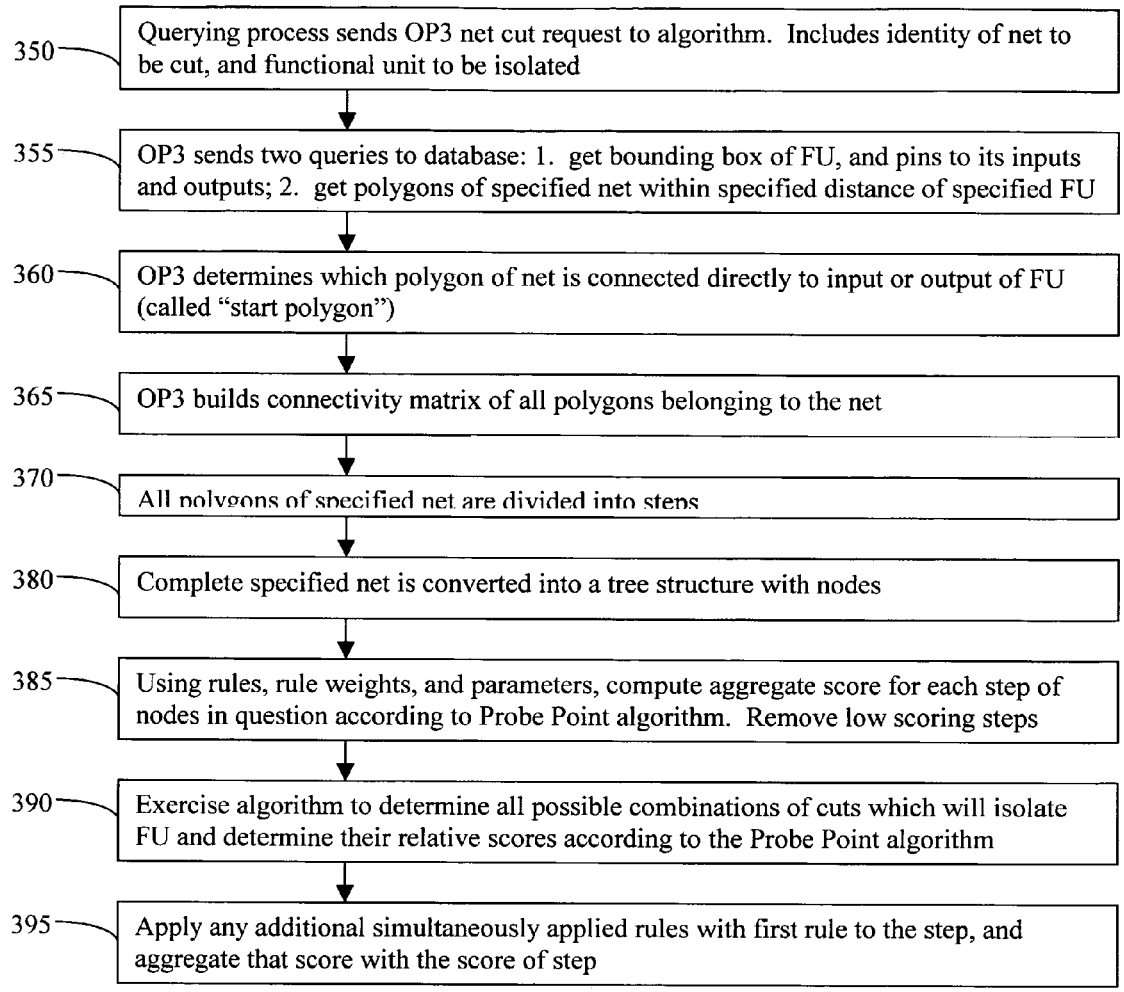
FIG. 3b is a flow chart of the OP3 net cutting algorithm.

The functioning of the net cutting algorithm is illustrated in FIG. 3b and described below.

In flow step 350, a querying process sends an OP3 net cut request to the algorithm. The input to the algorithm, as outlined above, includes the identity of the net which must be cut, as well as the functional unit which must be isolated.

In flow step 355, OP3 sends two queries to the database:

1. The first query is regarding the functional unit, to get its bounding box as well as the pins which represent its inputs and outputs. The user selects the functional unit or units on a schematic viewer and the database returns the bounding boxes and the pins 2. The second query is regarding the net in question. The query requests, and the database provides, all the polygons of the net which are located within a certain specified distance (specified by the applied rules described above) of the functional unit's boundaries. In flow step 360, once OP3 has received its results from the database, it uses the bounding box information of the functional unit to establish which polygon of the net is connected directly to the input or output of the functional unit. This is trivial, since this should be the only polygon of the net which lies within the bounding box of the functional unit and which also intersects with one of the pin locations of the functional unit.

Figure 4:
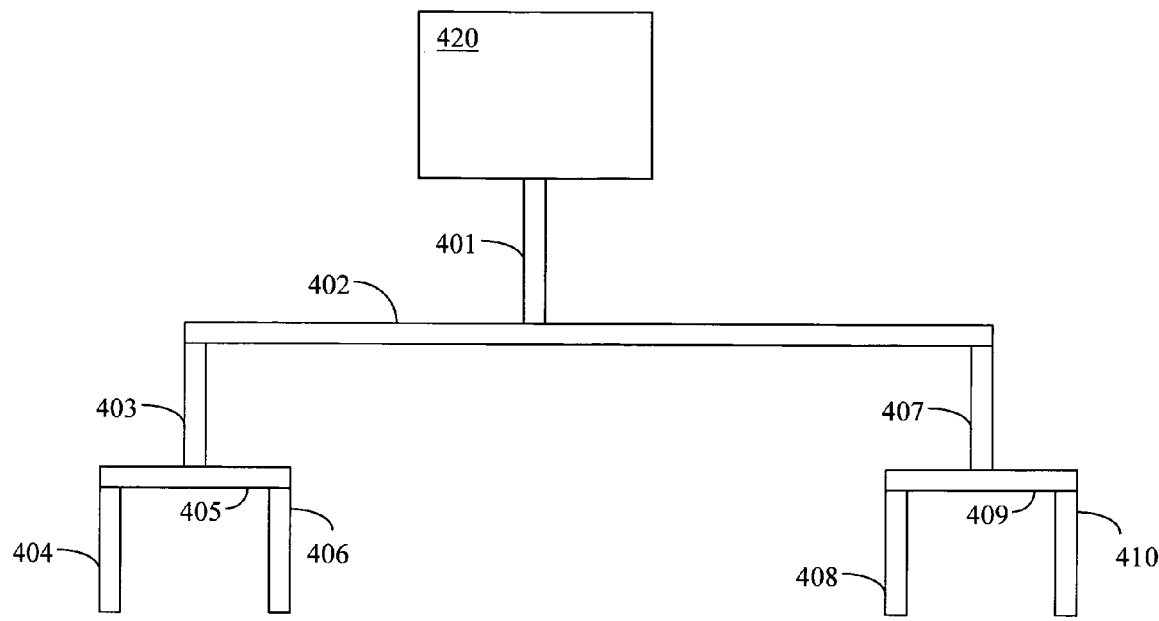
FIG. 4 shows a sample connectivity matrix used in the net cut algorithm.

In flow step 365, after the polygon of step 360 (known as the "start polygon") has been identified, OP3 builds a connectivity matrix of all the polygons belonging to the net based upon their bounding box intersections. An example of a portion of such a connectivity matrix is shown in FIG. 4. Polygons 401-410 are in the vicinity of Functional Unit 420. This is used to determine groups of polygons on which cuts should be placed in order to insure complete isolation from the functional unit.

In flow step 370, all of the polygons of the specified net are divided into steps as per flow step 310 in the probe point algorithm.

Figure 5:
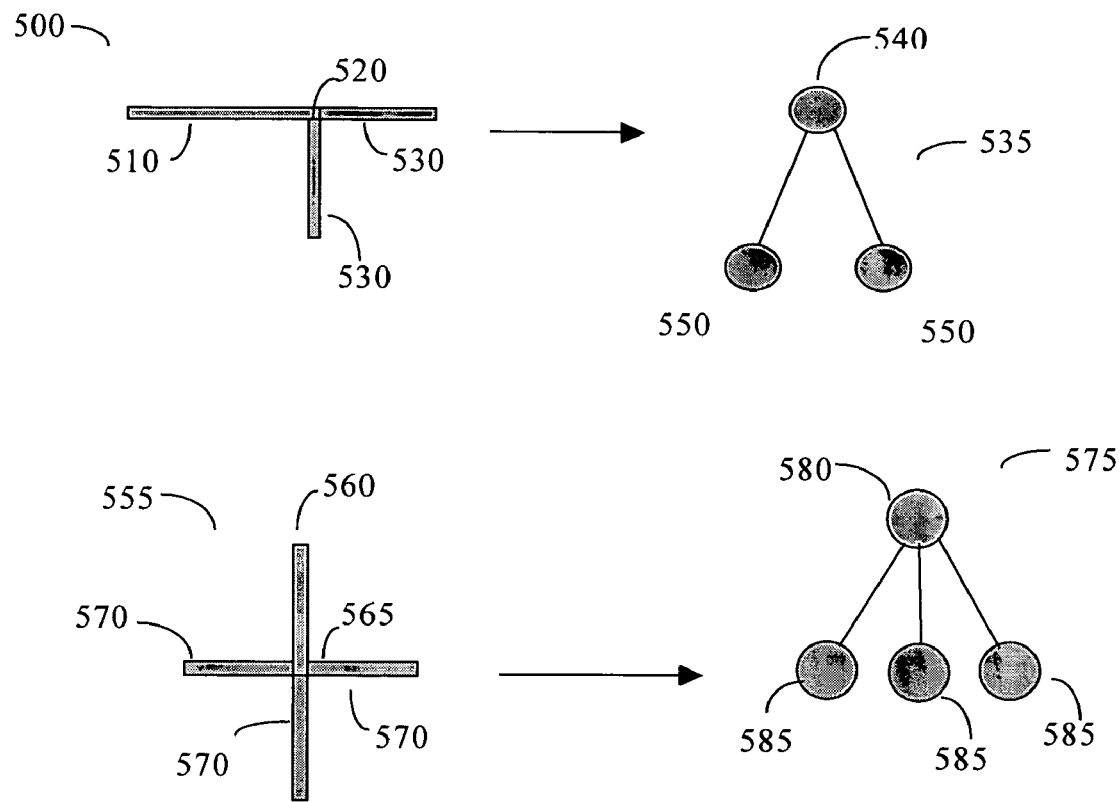
FIG. 5 illustrates conversion of a net layout to a tree structure.

In flow step 380, the complete specified net is converted into a tree structure wherein each node contains all the steps situated between two bifurcating or trifurcating polygonal connections. FIG. 5 illustrates this conversion. Bifurcating polygonal structure 500 shows incoming polygon 510 reaching intersection 520 and branching into outgoing polygons 530. Node 540 therefore in this case consists of polygon 510. The corresponding tree structure 535 includes node 540 branching into nodes 550 which are the children of node 540, and each of which consist of a polygon 530. Trifurcating polygonal structure 555 shows incoming polygon 560 (which also represents node 580) reaching intersection 565 and branching into three outgoing polygons 570. The corresponding tree structure 575 includes node 580 branching into three nodes 585 which are the children of node 580, and each of which consist of a polygon 570. Using this tree structure, if a cut is placed on any step which is contained within a node, all the children nodes and steps will be effectively isolated as well. The tree of interest is rooted from the polygon of the net which is connected to FU needing to be isolated. There will be many combinations of cut positions which will achieve the necessary isolation, and the algorithm as outlined herein determines which of these combinations is optimal according to the total probe point scores described earlier.

In flow step 385, using the rules, rule weights, and parameters described above, referred to as the Recipe File, the aggregate "probe point suitability" score is computed for each step of the nodes in question according to the probe point algorithm. Those steps with aggregate scores below a minimum value as set by the user are removed. This can be compared to a tree pruning procedure where all steps falling below a given threshold value are pruned off the main tree and released.

Figure 6:
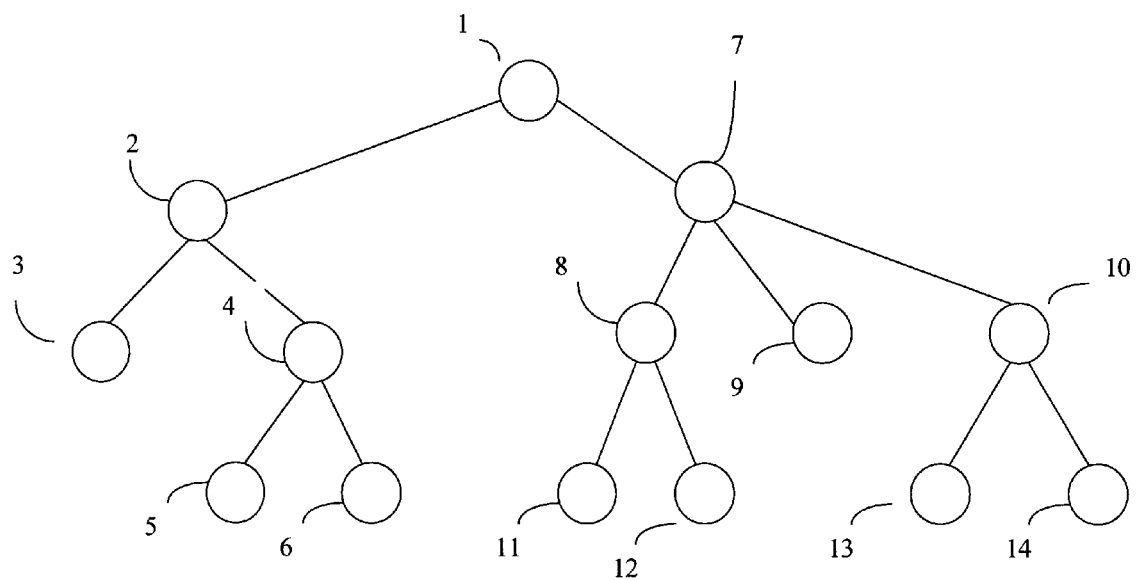
FIG. 6 illustrates possible cut combinations for a sample tree structure.

In flow step 390, an algorithm to determine all possible combinations of cuts which will isolate the FU, and their relative scores according to the probe point algorithm, is exercised as follows, and applied to the particular tree structure which is illustrated in FIG. 6. The method, a specific example of a well-known technique known as a tree traversal scheme, can be extended to general tree structures, and furthermore, the particular tree traversal scheme outlined herein is merely exemplary—other tree traversal schemes can be utilized to obtain the same node cut combination results.

In algorithm step 602(a) place a cut on root node 1 and mark it as a cut set [1].

In algorithm step 602(b) descend to the next level.

In algorithm step 602(c) place cuts on all siblings 2 and 7 at this level, and mark these as a cut set [2,7].

In algorithm step 602(d) descend into leftmost sibling 2. If the leftmost sibling has already been descended into or has no children, move to the sibling to its immediate right.

In algorithm step 602(e) save the values of the siblings of the node which is descended into as a stack. In the case of the exemplary tree structure, the stack={7}.

In general:

(f) a new set of siblings is "pushed", i.e., added to the top of the stack when descending a level;

(g) a set of siblings is "popped off" i.e., removed from the top of the stack when ascending or moving up a level.

(h) If there are no more siblings or siblings with children, move up a level and move to the sibling to the right. Also in general, (i) append the siblings from previous parent stages, i.e. the stack, to the children of the current node and mark as a cut set.

(j) If the entry in the parent set which is on has any left siblings, mark the current cut set as a separate set called a recursion set. Then, (k) for each left sibling, descend into the left sibling and append each sibling pair/triplet as well as all leaf nodes (i.e., the nodes at the end of each branch) to the current cut set after removing the parent from which it is descended and (l) mark that as a cut set as well. Then, (m) return to algorithm step 602(d). These steps (f)-(m) will be illustrated for the exemplary structure as follows:

In algorithm step (i) append the children 3,4 of the current node 2 to the stack and mark these as a cut set. This yields a cut set [3,4,7].

In algorithm step (d) since the leftmost child 3 of current node 2 has no children, move to the sibling to the right, i.e., 4, (e) add the siblings of current node 4, i.e., 3, to the stack, yielding a stack of {3,7,}.

Return to algorithm step (i) and append the children 5,6 of current node 4 to the stack and mark these as a cut set. This yields a cut set [3,5,6,7].

Since 5 and 6 have no more siblings or siblings with children, according to h), move up a level, i.e., to node 2. Then, according to g), pop off sibling 3 from the stack, leaving a stack of {7}.

Since 3 and 4 have no more siblings or siblings with children, according to (h), move up a level, i.e., to node 1. Then, according to (g), pop off sibling 7 from the stack, leaving an empty stack.

Since the leftmost child 2 of current node 1 has already been descended into, according to (d), move to the sibling to the right, i.e., 7, and descend into 7. According to (f), sibling 2 is added to the stack, yielding a stack {2}.

According to (i), append the children 8,9,10 of the current node to the stack {2} to yield a cut set [2,8,9,10].

According to (j), (k), and (1), parent node 7 has a left sibling, so descend into 2 and append in order 3,4 and 3,5,6 to 8,9,10, removing 2 from current cut set [2,8,9,100, and mark each of [3,4,8,9,10] and [3,5,6,8,9,10] as cut sets. The procedure is continued until all nodes have been covered. In the case of the exemplary tree structure, the following possible cut combinations are found: {1}; {2,7}; {3,4,7}; {3,5,6,7}; {2,8,9,10}; {3,4,8,9,10}; {3,5,6,8,9,10}; {2,11,12,9,10}; {3,4,11,12,9,10}; {3,5,6,11,12,9,10}*; {2,8,9,13,14}; {3,4, 8,9,13,14}; {3,5,6,8,9,13,14}*; {3,5,6,11,12,9,13,14}*.

A maximum number of cuts to be considered may be specified by the user. If, for example, a maximum number of 6 cuts is specified, the configurations with a * are not considered. The remaining cut configurations are each associated with a score, and the choice of cut combinations is made accordingly. The highest score may not necessarily be the preferred option for the FIB operator, since it may entail an operation which the operator would rather not do as a matter of preference or experience. Therefore, in flow step 395, a set of top scored configurations is returned, leaving the final strategy and decision to the operator or user.

3. Net Joining OP3 Algorithm

In some cases a user may wish to extend a net signal into other areas of the silicon real estate. For this purpose the use may decide to join two nets after isolating one of the nets from its driving signal. In another situation a user may wish to join a net to the input or output of a given functional unit or to connect unused I/O's of one or more FU's. In another case, two nets may need to be reversed, i.e., the output or input of one net may need to be isolated from the input of a FU and switched to the input of another net's FU and vice versa. In any of the above situations, the Net Joining Algorithm is used.

Requirements for the Algorithm

The following inputs are similar to the joining of two probe points, but additionally the distance between the two points is taken into consideration.

| Requirements | Explanation |
| --- | --- |
| Net Name A | This represents the first Net, which needs to be joined |
| Net Name B | This represents the second net, which will be joined to net A. This could nowever also be the name of a FU input pin to which net A may be joined. |
| Locality | a locality may be provided in order to restrict the search to within that region only. In case the locality is not provided the algorithm conducts a search for the best locations over all the polygons of the given features, i.e., the two nets which must be joined. It is necessary however for the locality to contain at least one sub feature of both the features which are to be joined. |
| Rules & Rule Weights | There are several rules, which are specified, in order to determine whether a particular point is better suited for joining as compared to other points. This comparison between the different points is done based on a particular set of rules. In some cases, some rules may be more important than others, and so weights are provided for each of the rules in order to emphasize or de-emphasize the application of that particular rule. In the case of a Net Join, there is an additional rule known as the distance rule which states that the closer two points are two each other, the more desirable they are for the purpose of carrying out a join operation. It is evaluated just like the other rules and weighted like the others based on information in the rule recipe file. |
| Process Type | The type of process could either be a Front Side process or a Backside process and selecting one or the other would cause an inversion of the rules being applied |
| Non Flexible Parameters of the edit | It may be the intention of the operator to deal with algorithm suggestions, which conform to one or more particular characteristic. E.g. the user may decide that a suggested join between two nets may not be any longer than a threshold value. |

-continued

| Requirements | Explanation |
| --- | --- |
| | Similarly a he may decide that the join suggested must lie within a particular resistance range. All these options can be specified using this input stream. |
| Joint Method | The method input relates to the way in which the joins are calculated. More information regarding this input is given in the details about the algorithm. |
| Number of Results | Using this input the user can control the number of suggestions to be returned by the algorithm |

Figure 7:
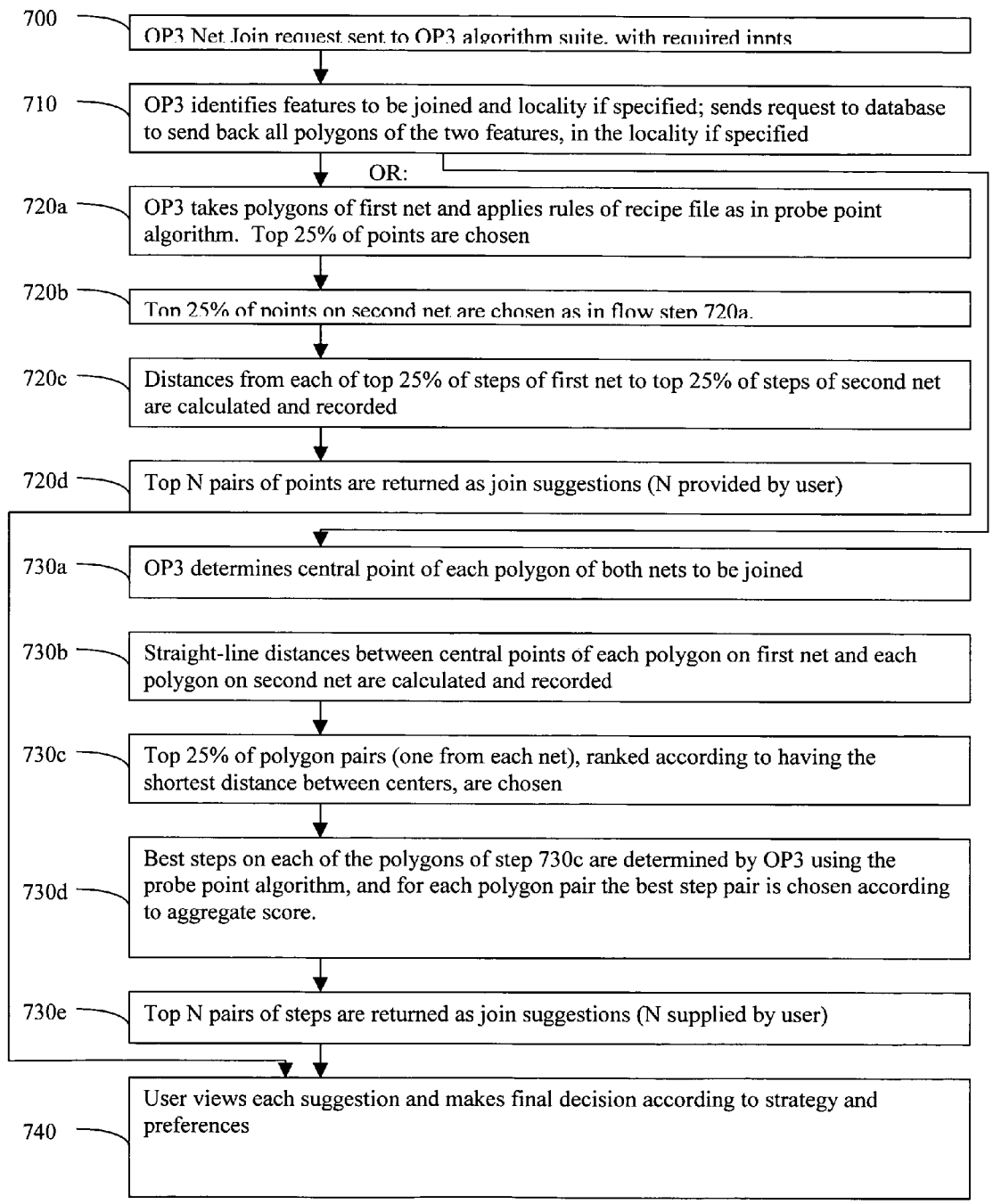
FIG. 7 is a flow chart of the OP3 net joining algorithm.

The functioning of the net joining algorithm is illustrated in FIG. 7 and described below.

In flow step 700, the querying agent sends an OP3 Net Join request to the OP3 algorithm suite, along with all the required inputs as outlined above.

In flow step 710, the algorithm identifies the two features which need to be joined, and also checks to see whether a locality is specified. Based on the results, the algorithm then sends a request to the database to send back all of the polygons related to the two features within the specified locality. If there is no locality specified, the request to database is modified such that all the polygons related to both the features are returned by the database.

Following flow step 710, a branch point occurs according to the method chosen. A first method utilizes flow steps 720a-d, whereas a second method utilizes flow steps 730a-e:

For the first method, in flow step 720a, OP3 takes the polygons of the first net and applies all the rules specified in the recipe file in the same way as is done for a probe point selection. The steps having an aggregate probe point suitability score in the top 25% are chosen.

In flow step 720b, the top 25% of steps for the second net are chosen as in flow step 720a.

In flow step 720c, the distances from each of the top 25% of steps of the first net to each of the top 25% of steps of the second net are calculated and recorded.

In flow step 720d, based on the number N of join suggestions requested by the user, the top N pairs of points, i.e., steps on the selected polygons, are returned as join suggestions, with the probe point score being factored into the distance score to determine the top join suggestions.

For the second method, in flow step 730a, OP3 takes all of the polygons of both the nets to be joined and determines the central point of each of the polygons.

In flow step 730b, the straight-line distances between the central point of each polygon on the first net and the central point of each polygon on the second net are calculated and recorded.

In flow step 730c, the top 25% of the polygon pairs i.e., one polygon from each net, ranked according to having the shortest distance between centers, are chosen.

In flow step 730d, the best steps on each of the polygons chosen in flow step 730c are determined by the OP3 algorithm using the probe point method, and for each polygon pair calculates the best step pair, i.e., the best set of two steps, with one step on each polygon of a polygon pair, in terms of the aggregate probe point suitability score. At the end, if there were X pairs of polygons chosen from flow step 730c, then there should be X pairs of steps chosen at the end of flow step 730d.

In flow step 730e, based on the number N of join suggestions requested by the user, the top N pairs of steps are returned as join suggestions.

In flow step 740, for each method above, the user or operator views each suggestion and makes the final decision according to strategy and preferences.

The inventive OP3 algorithm suite provides an extension of prior probe point placement algorithms outlined in previously incorporated U.S. Pat. No. 5,675,499. According to the inventive methods, optimal placement for net cuts and net joins can be determined, which greatly enhances the utility of the algorithm suite for assisting the user in making layout structural changes while maintaining logic design integrity. The enhanced algorithm suite includes a user interface enabling the user to provide preferences, limitations, and constraints in order to bias the search to be conducted. The suite uses the provided design data in order to locate the best positions for particular edit schemes, including net cuts and net joins.

It is not intended that the invention be restricted to the exact embodiments disclosed herein. It should be apparent to one skilled in the art that changes and modifications to the embodiments can be made without departing from the inventive concept. For example, the methods can be employed for other circuit editing techniques than FIB, such as electron beam or laser beam editing techniques. Other types of rules and parameters can be used in addition to those listed. The scope of the invention should be construed in view of the claims.

With this in mind, we claim:

1. A method of automating a determination of at least one optimal edit location on an integrated circuit for a purpose of making layout structural changes while maintaining logic design integrity, comprising method steps of:
  a. providing a database for said integrated circuit, said database including functional unit placement and connectivity data including conducting net data, and building block data of different functional units and features in layout form, said database containing said functional unit placement and connectivity data, and said building block data of different functional units and features being in polygon form;
  b. providing layer-by-layer layout information for said integrated circuit;
  c. providing an interface with said database to acquire all feature polygons on a given integrated circuit design;
  d. applying user defined constraints and limitations provided by a user to optimize edit location searches;
  e. using enhanced algorithms to find, from said database and said layer-by-layer layout information, the at least one optimal edit location under said user defined constraints; and
  f. reporting said at least one optimal edit location to said user.

2. The method of claim 1, wherein:
  said functional unit placement and connectivity data comprises a Design Exchange Format file (DEF);
  said building block data of different functional units in layout form comprises a Library Exchange (LEF) file; and
  said layer-by-layer layout information for said integrated circuit comprises a Gridded Data Set (GDS).

3. The method of claim 1, wherein said at least one optimal edit location is a net cut location.

4. The method of claim 1, wherein said at least one optimal edit location is a net join location.

5. The method of claim 1, wherein said method step of providing an interface with said database to acquire all feature polygons on a given integrated circuit design includes method steps of:

a) getting all the feature polygons which relate to a particular net within said integrated circuit design;
b) getting all the feature polygons which relate to a particular field of view; and
c) getting all the feature polygons which relate to a particular wild card search based on a hierarchical naming convention.

6. The method of claim 1, wherein said method step of applying user defined constraints and limitations provided by a user to optimize edit location searches comprises providing the user with an interface which enables the user to:
a) specify a set of rules governing the edit location searches;
b) determine an order in which said rules are applied;
c) determine weights of said rules such that results returned from that cycle of evaluation are biased one way or another;
d) utilize rule bypass options in order to prevent evaluation of results from a search based on an inappropriate or unsuitable rule;
e) specify threshold values to ensure that only those results meeting a predetermined quality level are returned; and
f) determine a maximum number of results to be reported.

7. The method of claim 1, wherein said method step of using enhanced algorithms to find at least one optimal edit location under said user defined constraints includes at least one of:
a) given a net and a particular set of evaluation rules, evaluating all locations of the net in order to establish which are the best locations on the net to place a probe point;
b) given two nets or one net and a functional unit, finding the best schemes which can be used to logically link said two nets or said one net and said functional unit;
c) given a net, or a net and a functional unit, deciding which are the best schemes of isolating the net from the functional unit, or isolating any given two points on the net; and
d) iteratively extending an isolation of two points on a net to an isolation of two sets of points on same net, and returning a set of edits, subject to a maximum number if required, which would achieve said isolation of two sets of points on the same net.

8. The method of claim 7, wherein said method step of, given a net, or a net and a functional unit, deciding which are the best schemes of isolating a net from a functional unit, or isolating any given two points on the net comprises isolating a net from a functional unit, said method comprising method steps of:
a) said user providing
1) a name of the net which needs to be isolated from the functional unit;
2) the functional unit which is to be isolated from the net, said net driving an input or an output of said functional unit;
3) a locality to restrict a search for polygons to said locality;
4) rules and optional rule weights and optional rule application orders to determine suitability of points for cutting;
5) a process type; wherein said process type is selected from frontside process and backside process;
6) non flexible parameters of an edit;
7) a maximum number of cuts; and
8) a number of results to be returned by the enhanced algorithms;

b) said enhanced algorithms querying the database to obtain a bounding box and input and output pins of said functional unit, and to obtain all polygons of the net which needs to be isolated from the functional unit, within said locality, including a polygon connected to one of said input and output pins of said functional unit, and dividing all said polygons of the net which needs to be isolated from the functional unit into steps;
c) said enhanced algorithms building a connectivity matrix of all said polygons of the net which need to be isolated from the functional unit, and converting entire said net into a tree structure wherein each node contains all the steps situated between two bifurcating or trifurcating polygonal connections;
d) said enhanced algorithms computing a probe point suitability score for each step of said each node according to said rules and said optional rule weights, all said steps having scores below a minimum value being removed;
e) said enhanced-algorithms determining all possible combinations of cuts on said steps of said nodes of said tree structure which will isolate said functional unit from said net, subject to said maximum cut number, each combination of said all possible combinations of cuts on said steps of said nodes of said tree structure which will isolate said functional unit from said net comprising a cut set, and said enhanced algorithms further determining relative scores of all said cut sets, each said score of said cut set comprising a sum of the scores of the best scoring step of each node being cut in said cut set; and
f) said enhanced algorithms reporting said all possible combinations of cuts to the user.

9. The method of claim 8, wherein said all the steps are of substantially equal size, of one of square and rectangular shape.

10. The method of claim 9, wherein said all the steps have a dimension in the range between 45×45 nm and 90×90 nm.

11. The method of claim 8, wherein said method step of determining all possible combinations of cuts on said nodes of said tree structure which will isolate said functional unit from said net utilizes a tree traversal scheme.

12. The method of claim 7, wherein said method step of, given two nets or a net and a functional unit, finding the best schemes which can be used to logically link said two nets or said one net and said functional unit comprises method steps of:
a) said user providing
1) a name of the first net which needs to be joined;
2) a name of the second net which needs to be joined;
3) a locality to restrict a search for polygons to said locality;
4) rules and optional rule weights and optional rule application orders to determine suitability of points for joining;
5) a process type, wherein said process type is selected from frontside process and backside process;
6) non flexible parameters of an edit;
7) a join calculation method; and
8) a number N of results to be returned by the enhanced algorithms;
b) said enhanced algorithms querying the database to obtain the polygons related to said first and second nets in said locality;
c) said enhanced algorithms dividing each said polygon related to said first net and said second net into steps; and
d) said enhanced algorithm determining the top N pairs of steps as net join suggestions, and reporting said top N pairs of steps to the user.

13. The method of claim 12, wherein said method step of said enhanced algorithm determining the top N pairs of steps as net join suggestions, and reporting said top N pairs of steps to the user comprises method steps of:
a) said enhanced, algorithms determining probe point suitability scores for each said step of said first and second nets;
b) said enhanced algorithms choosing the steps having a top portion of said probe point suitability scores for each of said first and second nets;
c) said enhanced algorithms calculating distances from each of said steps having said top portion of said probe point suitability scores for said first net and each of said steps having said top portion of said probe point suitability scores for said second net;
d) said enhanced algorithms determining from said distances and said probe point suitability scores for the top N pairs of steps, and reporting said top N pairs of steps as join suggestions to said user.

14. The method of claim 13, wherein said top portion is the top 25%.

15. The method of claim 13, wherein the method step of said enhanced algorithms determining probe point suitability scores comprises method steps of:
a) determining whether an edit if placed at a given step would violate any of said non-flexible parameters;
b) computing a probe point suitability subscore for each step for which no non-flexible parameters are violated, for each said rule;
c) applying any said optional rule weights to each said probe point suitability subscore to provide weighted subscores; and
d) combining said weighted subscores to produce said probe point suitability score for each said step of said first and second nets.

16. The method of claim 15, wherein said probe point suitability subscore is normalized to be between 0 and 1.

17. The method of claim 12, wherein said method step of said enhanced algorithm determining the top N pairs of steps as net join suggestions, and reporting said top N pairs of steps to the user comprises method steps of:
a) said enhanced algorithms determining a central point of each said polygon of said first and second nets in said locality;
b) said enhanced algorithms calculating straight-line distances between said central point of each polygon of said first net and said central point of each polygon of said second net, each of said straight-line distances being a distance between polygon pairs;
c) said enhanced algorithms determining and recording a top portion of said polygon pairs, said polygon pairs being ranked according to having the shortest of said straight-line distances;
d) said enhanced algorithms determining probe point suitability scores for each said step of said first and second nets, selecting the best of said steps for each said polygon of said top portion of said polygon pairs, and for each said polygon pair selecting the best step pair according to a sum of said probe point suitability scores for said best of said steps for each said polygon in said polygon pair; and
e) said enhanced algorithms determining the top N pairs of steps, and reporting said top N pairs of steps as join suggestions to said user.

18. The method of claim 17, wherein said top portion is the top 25%.

19. The method of claim 17, wherein the method step of said enhanced algorithms determining probe point suitability scores comprises method steps of:
a) determining whether an edit if placed at a given step would violate any of said non-flexible parameters;
b) computing a probe point suitability subscore for each step for which none of said non-flexible parameters are violated, for each of said rules;
c) applying any said optional rule weights to each said probe point suitability subscore to provide weighted subscores; and
d) combining said weighted subscores to produce said probe point suitability score for each said step of said first and second nets.

20. The method of claim 19, wherein said method step of selecting the best of said steps for each said polygon of said top portion of said polygon pairs comprises applying said rules in said rule application order.

21. The method of claim 20, wherein said method step of applying said rules in said rule application order includes method steps of:
a) applying the first rule and any simultaneously applied rules to each said step and aggregating the probe point suitability scores;
b) selecting the steps having said top portion of said aggregated probe point suitability scores;
c) applying the second rule and any simultaneously applied rules to each said step and aggregating the probe point suitability scores with the previously aggregated probe point suitability scores; and
d) repeating said method steps b) and c) until all the rules are applied or there is only one step remaining.

22. The method of claim 1, wherein said method step of reporting said at least one optimal edit location to said user includes method steps of:
connecting a system housing the enhanced algorithms to a layout display system;
subject to a number of results requested by the user, displaying all edit suggestions to the user; and
said user viewing each of said edit suggestions, its characteristics and scores, and selecting a preferred said edit suggestion.

23. The method of claim 1, wherein said at least one edit location is a FIB edit location.

24. An automated system for determining edit locations on an integrated circuit, said automated system including:
a) a database for said integrated circuit, said database including functional unit placement and connectivity data including conducting net data, and building blocks data of different functional units and features in layout form, said database containing said functional unit placement and connectivity data, and said building block data of different functional units and features being in polygon form;
b) layer-by-layer layout information for said integrated circuit;
c) an interface with said database to acquire all feature polygons on a given integrated circuit design;
said automated system configured to:
d) apply user defined constraints and limitations provided by a user to optimize edit location searches;
e) use enhanced algorithms to find, from said database and said layer-by-layer layout information, at least one optimal edit location under said user defined constraints; and
f) report said at least one optimal edit location to said user.

25. The automated system of claim 24, wherein:
said functional unit placement and connectivity data comprises a Design Exchange Format file (DEF);
said building block data of different functional units in layout form comprises a Library Exchange (LEF) file; and
said layer-by-layer layout information for said integrated circuit comprises a Gridded Data Set (GDS).

26. The automated system of claim 24, wherein said automated system being configured to use enhanced algorithms to find the at least one optimal edit location under said user defined constraints includes said automated system being configured for at least one of:
   a) given a net and a particular set of evaluation rules, evaluating all locations of the net in order to establish which are the best locations on the net to place a probe point;
   b) given two nets or a net and a functional unit, finding the best schemes which can be used to logically link said two nets or said one net and said functional unit;
   c) given a net, or a net and a functional unit, deciding which are the best schemes of isolating the net from the functional unit, or isolating any given two points on the net; and
   d) iteratively extending an isolation of two points on a net to isolation of two sets of points on the same net, and returning a set of edits, subject to a maximum number if required, which would achieve said isolation of two sets of points on the same net.

27. The automated system of claim 24, further including:
a layout display system connected to said automated system;
wherein said layout display system, subject to a number of results requested by the user, displaying all edit suggestions to the user.

28. A computer-readable medium, said computer readable medium comprising a set of computer instructions for automating a determination of at least one optimal edit location on an integrated circuit for a purpose of making layout structural changes while maintaining logic design integrity, said computer instructions implementing the steps of:
   a) providing a database for said integrated circuit in a memory storage of an automated system, said database including functional unit placement and connectivity data including conducting net data, and building block data of different functional units and features in layout form, said database containing said functional unit placement and connectivity data, and said building block data of different functional units and features being in polygon form;
   b) providing layer-by-layer layout information for said integrated circuit;
   c) providing an interface with said database to acquire all feature polygons on a given integrated circuit design;
   d) applying user defined constraints and limitations provided by a user to optimize edit location searches;
   e) using enhanced algorithms to find, from said database and said layer-by-layer layout information, the at least one optimal edit location under said user defined constraints; and
   f) reporting said at least one optimal edit location to said user.

* * * * *